US010600876B2

(12) United States Patent
Xu et al.

(10) Patent No.: US 10,600,876 B2
(45) Date of Patent: Mar. 24, 2020

(54) METHODS FOR CHAMFERING WORK FUNCTION MATERIAL LAYERS IN GATE CAVITIES HAVING VARYING WIDTHS

(71) Applicant: GLOBALFOUNDRIES Inc., Grand Cayman (KY)

(72) Inventors: Guowei Xu, Ballston Lake, NY (US); Hui Zang, Guilderland, NY (US); Rongtao Lu, Rexford, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/974,037

(22) Filed: May 8, 2018

(65) Prior Publication Data
US 2019/0348508 A1 Nov. 14, 2019

(51) Int. Cl.
*H01L 29/40* (2006.01)
*H01L 29/66* (2006.01)
*H01L 21/311* (2006.01)
*H01L 21/3213* (2006.01)

(52) U.S. Cl.
CPC ...... *H01L 29/401* (2013.01); *H01L 21/31144* (2013.01); *H01L 21/32139* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| 6,267,649 | B1* | 7/2001 | Lai | B24B 9/065 |
| | | | | 451/397 |
| 6,583,029 | B2* | 6/2003 | Abe | B24B 9/065 |
| | | | | 257/E21.237 |
| 9,252,238 | B1* | 2/2016 | Trevino | H01L 29/66545 |
| 9,478,538 | B1* | 10/2016 | Kim | H01L 27/088 |
| 10,056,303 | B1* | 8/2018 | Patil | H01L 21/823842 |
| 10,121,875 | B1* | 11/2018 | Ho | H01L 29/0649 |
| 2002/0043527 | A1* | 4/2002 | Ito | H01L 21/67103 |
| | | | | 219/444.1 |
| 2012/0139061 | A1* | 6/2012 | Ramachandran | |
| | | | | H01L 21/76895 |
| | | | | 257/410 |

(Continued)

FOREIGN PATENT DOCUMENTS

EP          1189266 A1     3/2002

*Primary Examiner* — David E Graybill
(74) *Attorney, Agent, or Firm* — Amerson Law Firm, PLLC

(57) ABSTRACT

A method includes forming a first cavity having a first width and a second cavity having a second width greater than the first width in a dielectric material, forming a first conformal layer in the first and second cavities, forming spacers in the first and second cavities, the spacers covering a first portion of the first conformal layer positioned on sidewalls of the first and second cavities and exposing a second portion of the first conformal layer positioned on the sidewalls of the first and second cavities, forming a material layer in the first and second cavities to cover bottom portions of the first conformal layer, performing a first etch process to remove the second portion of the first conformal layer positioned on the sidewalls of the first and second cavities, removing the spacers and the material layer, and forming a fill material in the first and second cavities.

20 Claims, 12 Drawing Sheets

(56) References Cited

U.S. PATENT DOCUMENTS

| | | | |
|---|---|---|---|
| 2013/0187236 A1* | 7/2013 | Xie | H01L 29/4966 257/369 |
| 2014/0131808 A1* | 5/2014 | Ando | H01L 21/823842 257/369 |
| 2014/0131809 A1* | 5/2014 | Ando | H01L 21/02697 257/369 |
| 2015/0228656 A1* | 8/2015 | Schloesser | H01L 27/10876 257/334 |
| 2016/0064378 A1* | 3/2016 | Kwon | H01L 21/82345 257/401 |
| 2016/0163601 A1* | 6/2016 | Xie | H01L 21/28088 257/392 |
| 2017/0040220 A1* | 2/2017 | Kim | H01L 21/82345 |
| 2017/0287780 A1* | 10/2017 | Park | H01L 21/76897 |
| 2018/0261595 A1* | 9/2018 | Xie | H01L 27/0886 |
| 2019/0198400 A1* | 6/2019 | Miao | H01L 21/823462 |

\* cited by examiner

METHODS FOR CHAMFERING WORK FUNCTION MATERIAL LAYERS IN GATE CAVITIES HAVING VARYING WIDTHS

BACKGROUND OF THE INVENTION

1. Field of the Invention

The present disclosure generally relates to the fabrication of semiconductor devices, and, more particularly, to methods for chamfering work function material layers in gate cavities having varying widths.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

In an integrated circuit device, there are different performance requirements for different functional blocks or regions of the device. These different regions may require devices with gate structures having different widths. In device fabrication, the threshold voltages of the devices may be controlled by providing work function material (WFM) layers in the gate structures. To reduce the aspect ratio of the gate cavities, the WFM layers may be chamfered. During a chamfering process, a sacrificial material is provided to partially fill the gate cavities such that it exposes portions of the WFM layer disposed on upper sidewalls of the gate cavities. An etch process is performed to remove these exposed portions, and the sacrificial material is removed. The remaining portion of the WFM layer only lines the bottom portion of the gate cavity, thereby decreasing the aspect ratio of the upper portion for subsequent material depositions within the gate cavities. In devices with varying gate cavity widths, the thickness of the sacrificial layer also varies, as it is thicker in narrower gate cavities as compared to wider gate cavities. Subsequently, the final height of the WFM layer varies depending on the width of the gate cavity. Such variation in the WFM heights can lead to process defects.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes, among other things, forming a first cavity having a first width and a second cavity having a second width greater than the first width in a dielectric material, forming a first conformal layer in the first and second cavities, forming spacers in the first and second cavities, the spacers covering a first portion of the first conformal layer positioned on sidewalls of the first and second cavities and exposing a second portion of the first conformal layer positioned on the sidewalls of the first and second cavities, forming a material layer in the first and second cavities to cover bottom portions of the first conformal layer, performing a first etch process to remove the second portion of the first conformal layer positioned on the sidewalls of the first and second cavities, removing the spacers and the material layer, and forming a fill material in the first and second cavities.

Another illustrative method disclosed herein includes, among other things, forming placeholder gate structures above a substrate, forming first spacers on sidewalls of the placeholder gate structures, forming a dielectric layer between the first spacers, removing the placeholder gate structures between selected pairs of the first spacers to define first and second cavities, the first cavity having a first width and the second cavity having a second width greater than the first width, forming a gate insulation layer in the first and second cavities, forming a work function material layer above the gate insulation layer, forming second spacers in the first and second cavities, the second spacers covering a first portion of the work function material layer positioned on sidewalls of the first and second cavities and exposing a second portion of the work function material layer positioned on the sidewalls of the first and second cavities, forming a material layer in the first and second cavities to cover bottom portions of the work function material layer, performing a first etch process to remove the second portion of the work function material layer positioned on the sidewalls of the first and second cavities, removing the second spacers and the material layer, and forming a conductive fill material in the first and second cavities.

BRIEF DESCRIPTION OF THE DRAWINGS

The disclosure may be understood by reference to the following description taken in conjunction with the accompanying drawings, in which like reference numerals identify like elements, and in which.

Figure 1:
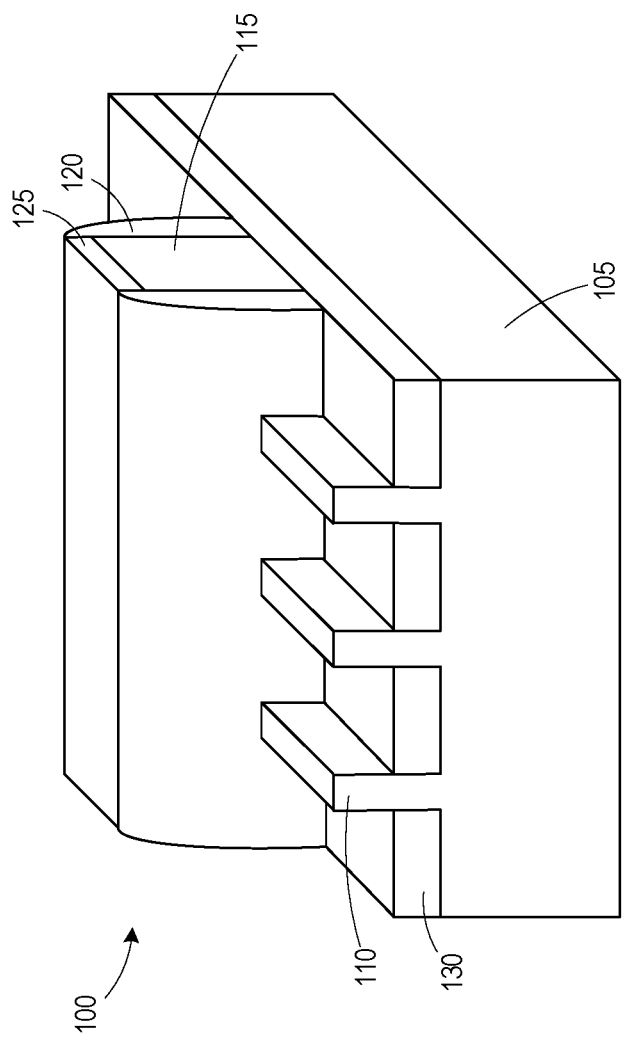
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates a method for chamfering work function material layers in gate cavities having varying widths and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2K illustrate various illustrative methods disclosed herein for forming an integrated circuit product 200. In the illustrated embodiment, the product includes finFET transistor devices, but the techniques described herein are not so limited, and they may be applied to other types of devices, such as planar devices. FIGS. 2A-2K show a cross-sectional view of the product 200 taken through the long axis of one of a first fin 205A formed in a substrate 210 in a first device region 215A, a second fin 205B formed in the substrate 210 in a second device region 215B, and a third fin 205C formed in the substrate 210 in a third device region 215C. The cross-sectional view is taken in a direction corresponding to the gate length direction of the product 200. In some cases, the one or more of the fins 205A, 205B, 205C may be portions of the same originally formed fin that extends across two or more of the device regions 215A, 215B, 215C. In other cases, the fins 205A, 205B, 205C may each be a part of a different originally formed fin.

In one illustrative embodiment, a replacement gate technique is used to form devices in the product 200. Placeholder gate structures 220A, 220B, 220C are formed above the fins 205A, 205B, 205C, respectively, prior to the formation of a replacement gate structure. The placeholder gate structures 220A, 220B, 220C each includes a sacrificial placeholder material 225A, 225B, 225C, such as polysilicon, and a gate insulation layer (not separately shown), such as silicon dioxide. Also depicted are illustrative gate cap layers 230A, 230B, 230C and sidewall spacers 235A, 235B, 235C, both of which may be made of a material such as silicon nitride. In the illustrated embodiment, the placeholder gate structures 220A, 220B, 220C each has a different width, depending on the functional requirements for the completed product 200 and the associated region 215A. 215B. 215C.

The transistor devices formed in the product 200 depicted herein may be either NMOS or PMOS transistors, or a combination of both. Additionally, various doped regions, e.g., halo implant regions, well regions and the like, may be formed but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205A, 205B, 205C may be formed in a process layer formed above the base layer of the substrate 210.

Figure 2A:
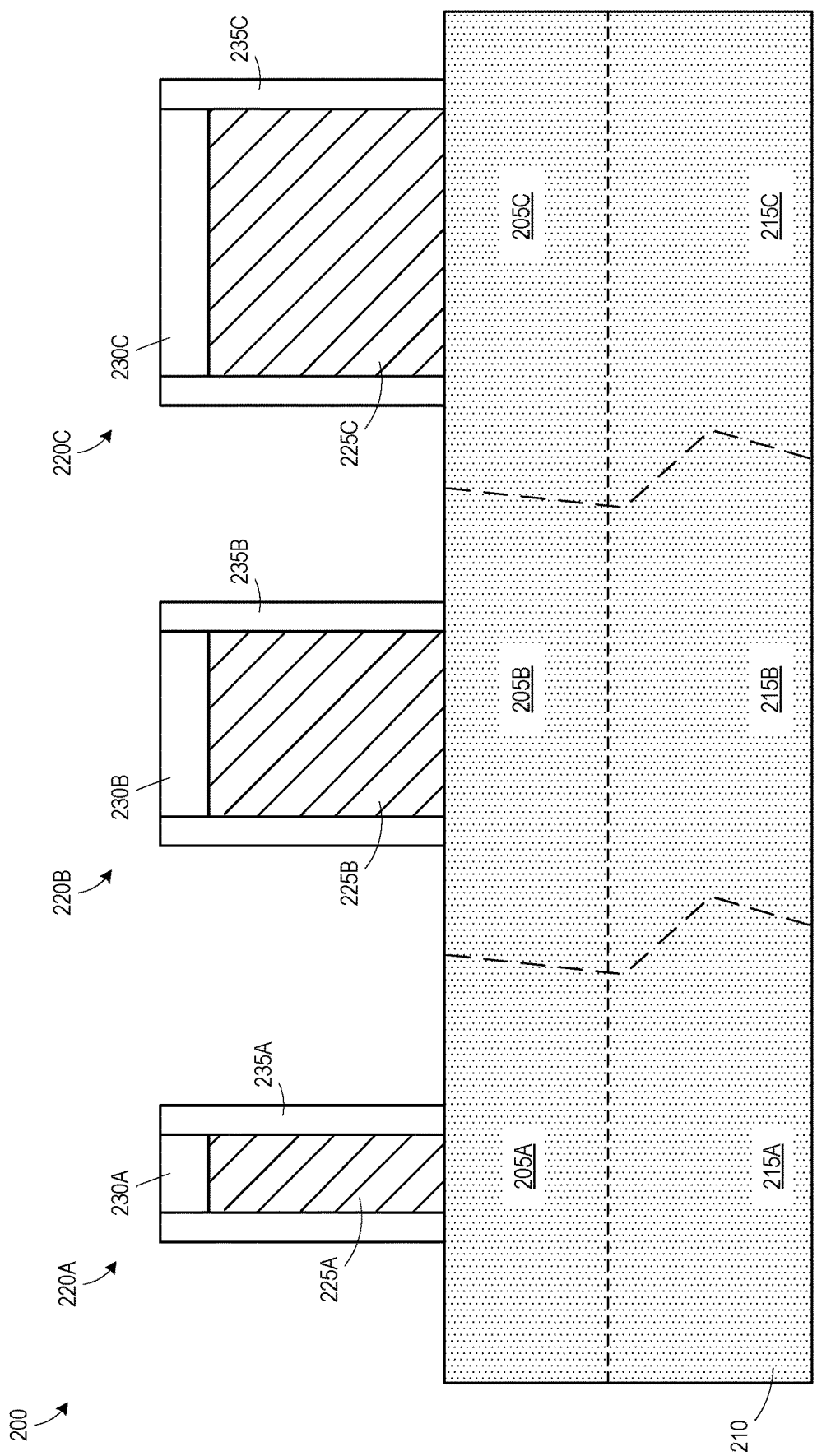
FIGS. 2A-2K depict a method for chamfering work function material layers in gate cavities having varying widths.
Figure 2B:
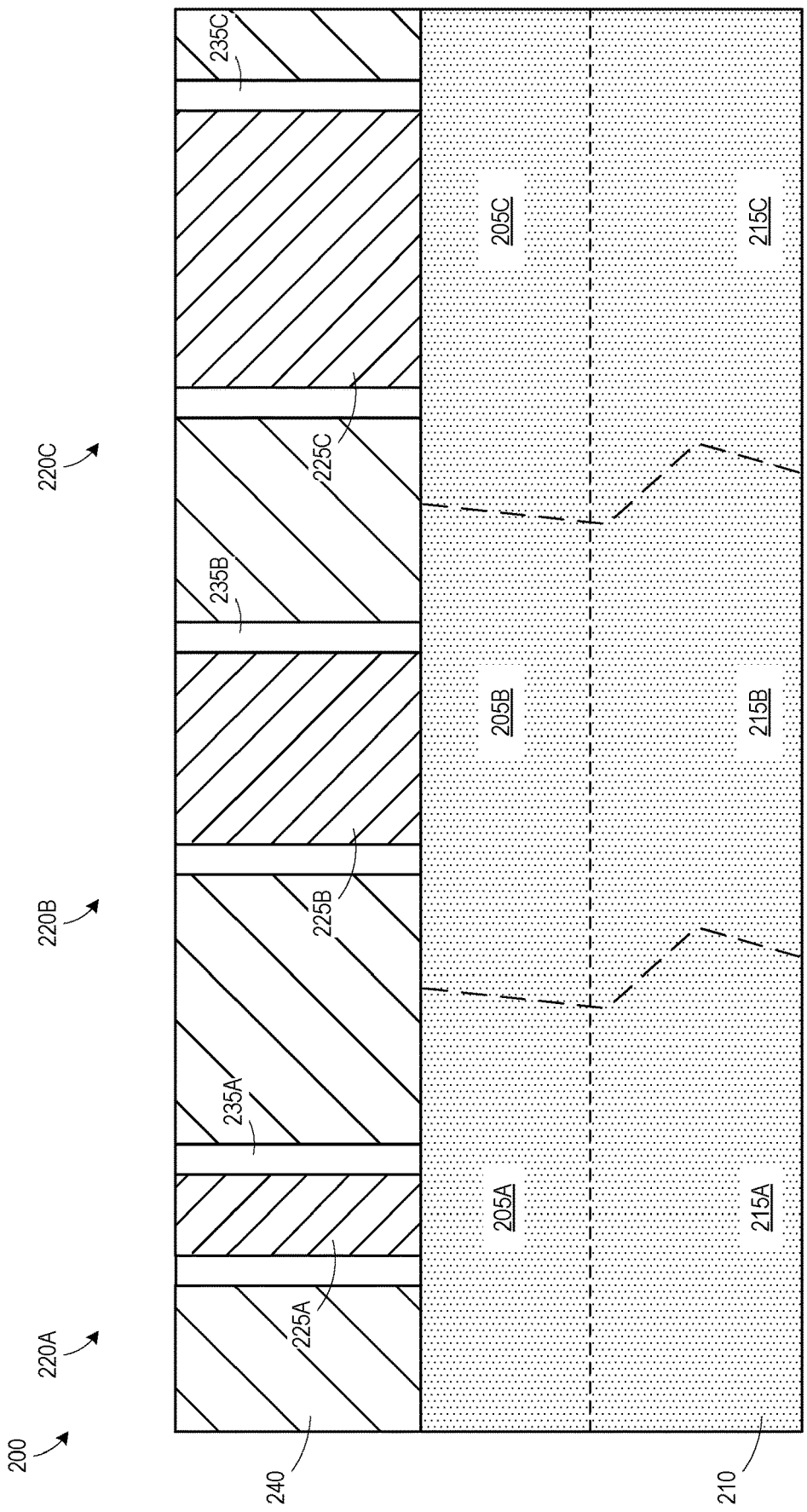

FIG. 2B illustrates the product 200 after a dielectric layer 240 was formed above the fins 205A, 205B, 205C and the placeholder gate structures 220A, 220B, 220C were planarized to remove the gate cap layers 230A, 230B, 230C and expose top surfaces of the sacrificial placeholder material 225A, 225B, 225C. In the illustrated embodiment, the dielectric layer 240 may be silicon dioxide, a low-k dielectric material having a dielectric constant of approximately 3.0 or lower, or an ultra-low-k (ULK) material having a dielectric constant of approximately 2.5 or lower.

Figure 2C:
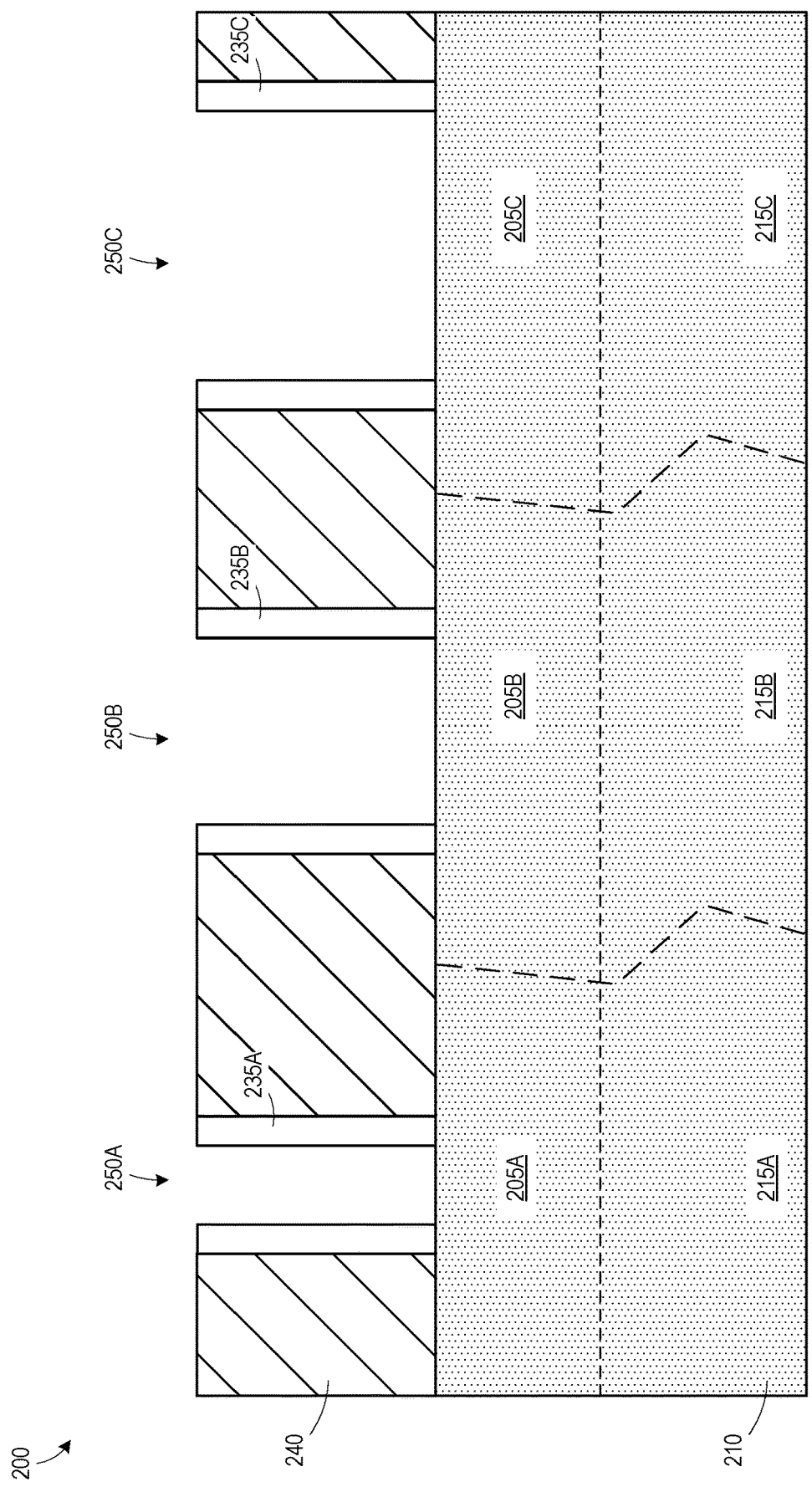

FIG. 2C illustrates the product 200 after a plurality of etch processes were performed to remove the sacrificial placeholder material 225A, 225B, 225C and any underlying gate dielectric layer, thereby defining gate cavities 250A, 250B, 250C.

Figure 2D:
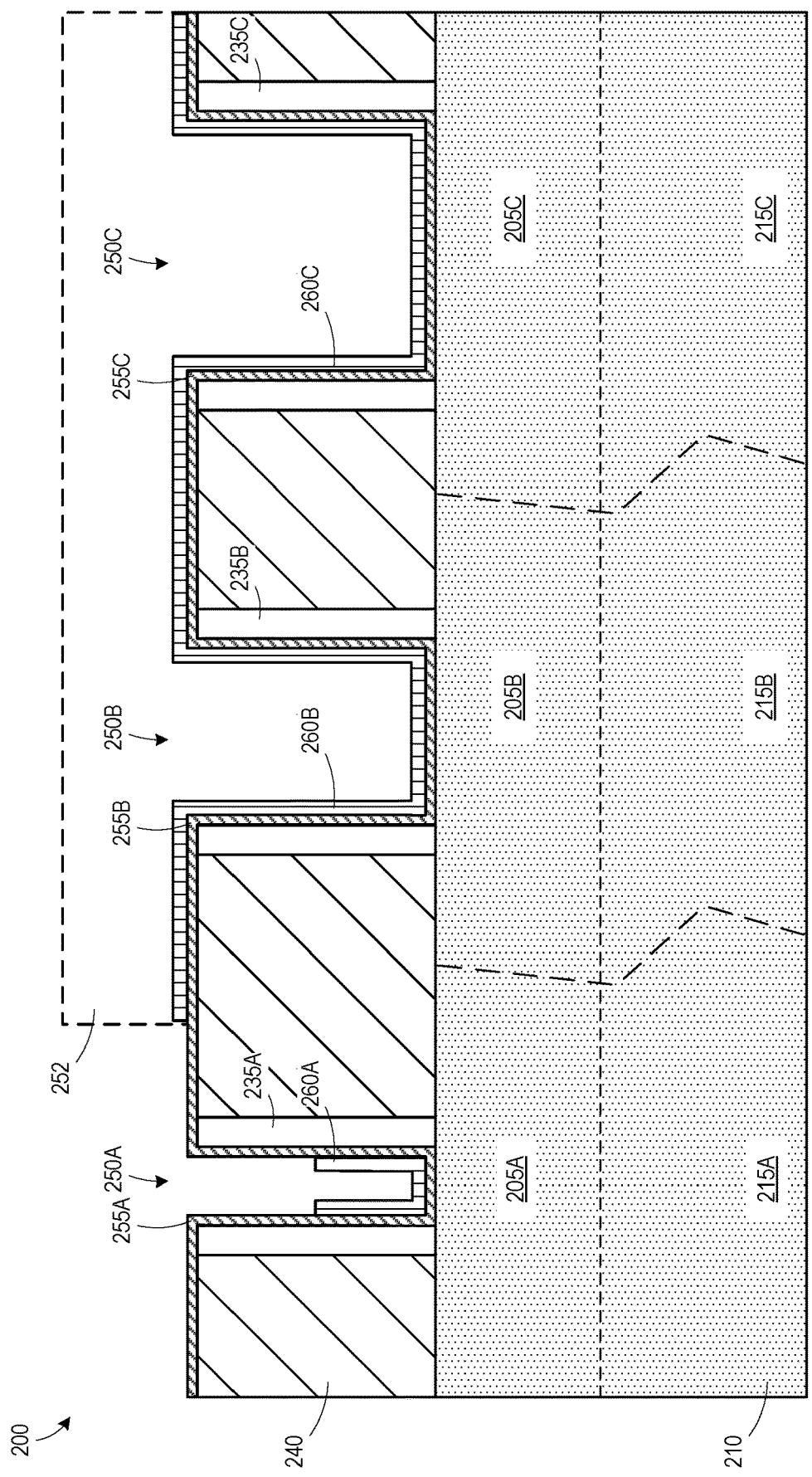

FIG. 2D illustrates the product 200 after several processes were performed. A first conformal deposition process was performed to form a gate insulation layer 255A, 255B, 255C in the gate cavities 250A, 250B, 250C. In the illustrated embodiment, the gate insulation layer 255A, 255B, 255C is a high-k (k greater than 10) insulation material (where k is the relative dielectric constant), such as hafnium oxide. A second conformal deposition process was performed to form a work function material (WFM) layer 260A, 260B, 260C (e.g., TiN for P-type devices and TiAlC for N-type devices) in the gate cavities 250A, 250B, 250C respectively. A first chamfering process was performed to chamfer the WFM layer 260A. For example, a sacrificial material, such as an organic patterning layer (OPL), was formed in the gate cavity 250A and recessed to expose upper portions of the WFM layer 260A. An etch process was performed to remove the exposed upper portions of the WFM layer 260A and the sacrificial material was removed, leaving the WFM layer 260A disposed in the lower portion of the gate cavity 250A. The gate cavities 250B, 250C may be masked by a mask layer 252 (shown in phantom) during the chamfering of the WFM layer 260A. The mask layer 252 is removed after chamfering the WFM layer 260A.

Figure 2E:
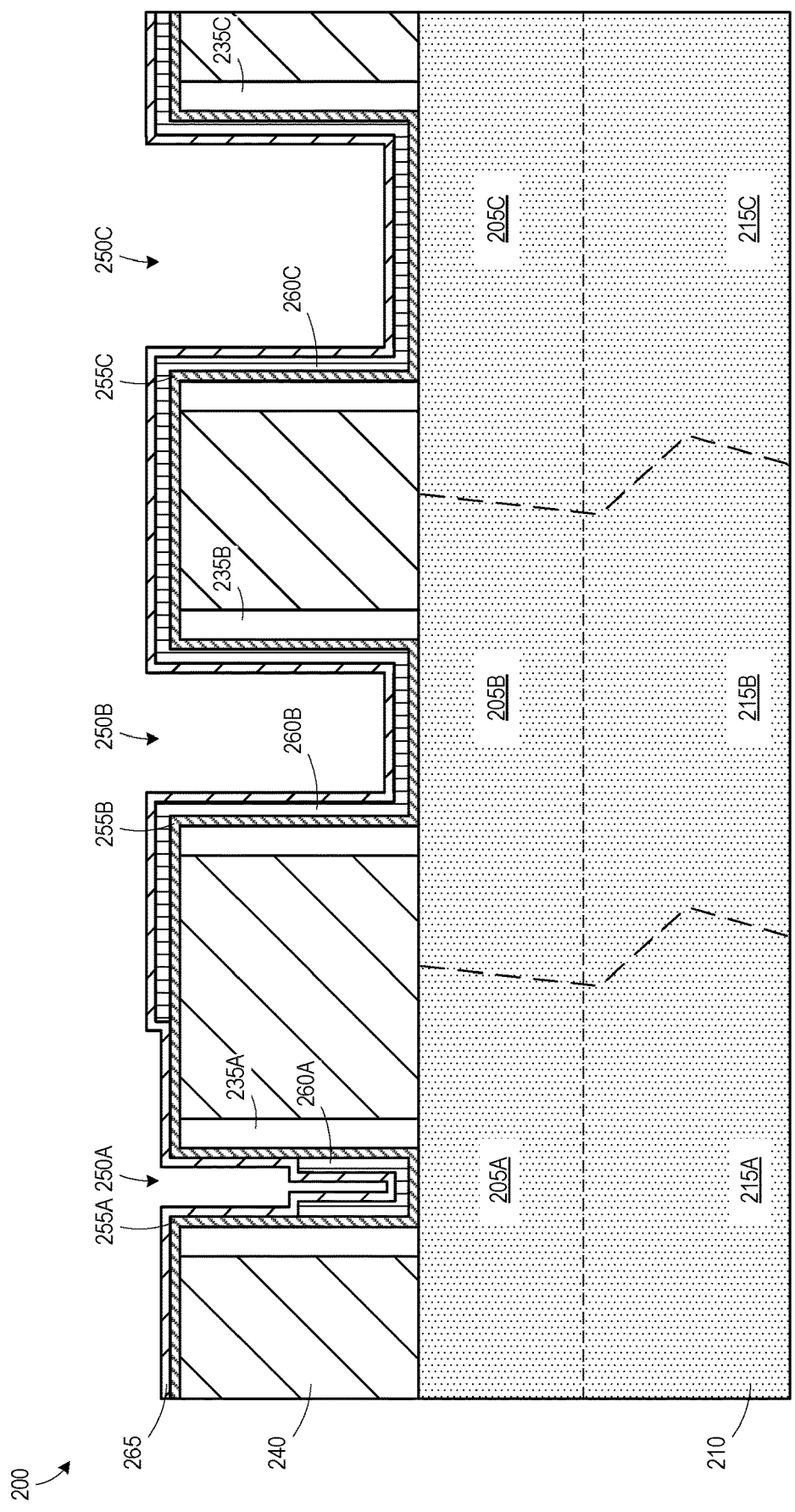

FIG. 2E illustrates the product after a conformal deposition process was performed to form a spacer layer 265 over the WFM layer 260A, 260B, 260C. The spacer layer 265 may be amorphous silicon (a-Si).

Figure 2F:
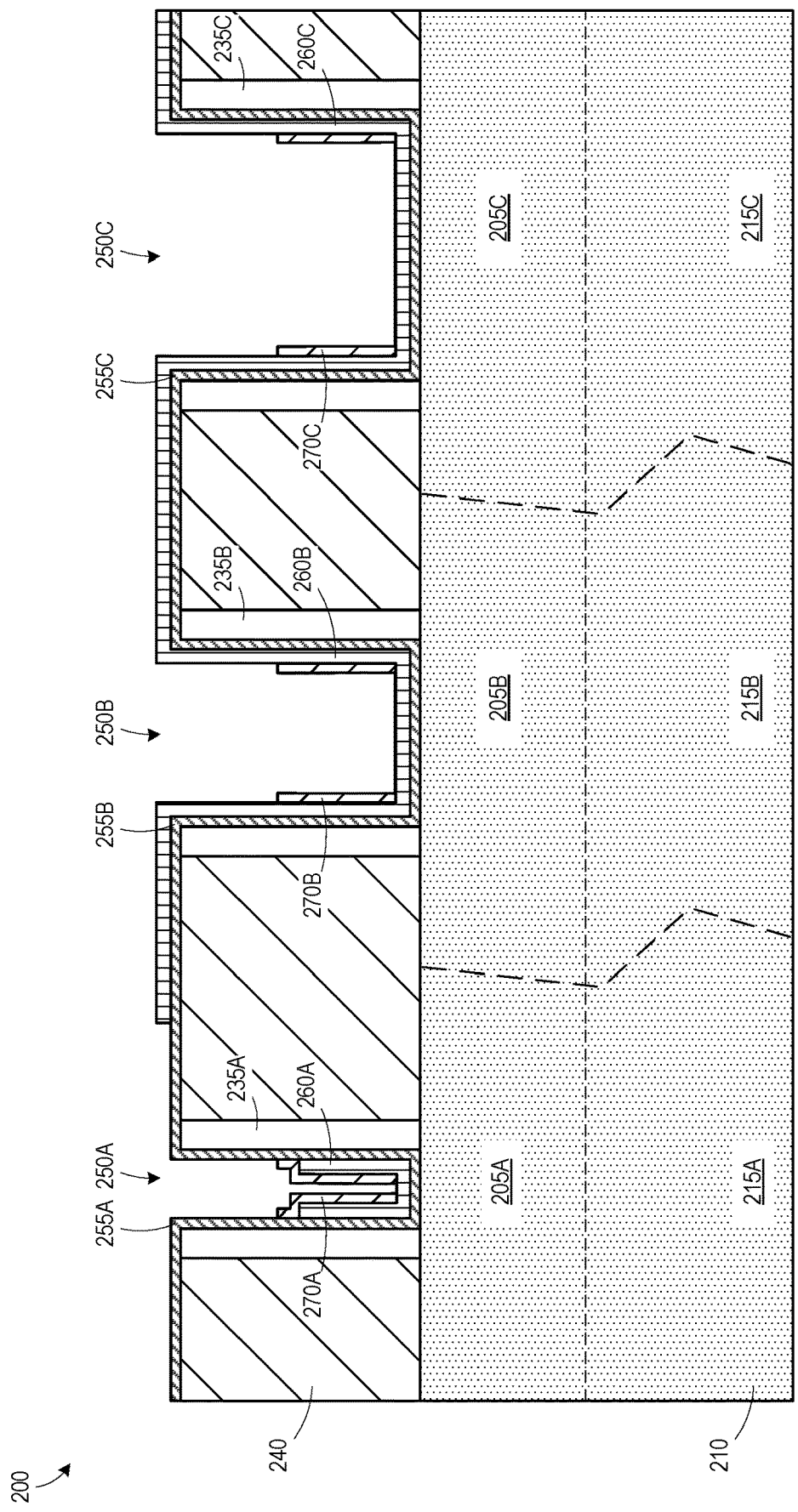

FIG. 2F illustrates the product 200 after an anisotropic etch process was performed to etch the spacer layer 265 to define spacers 270A, 270B, 270C in each of the gate cavities 250A, 250B, 250C.

Figure 2G:
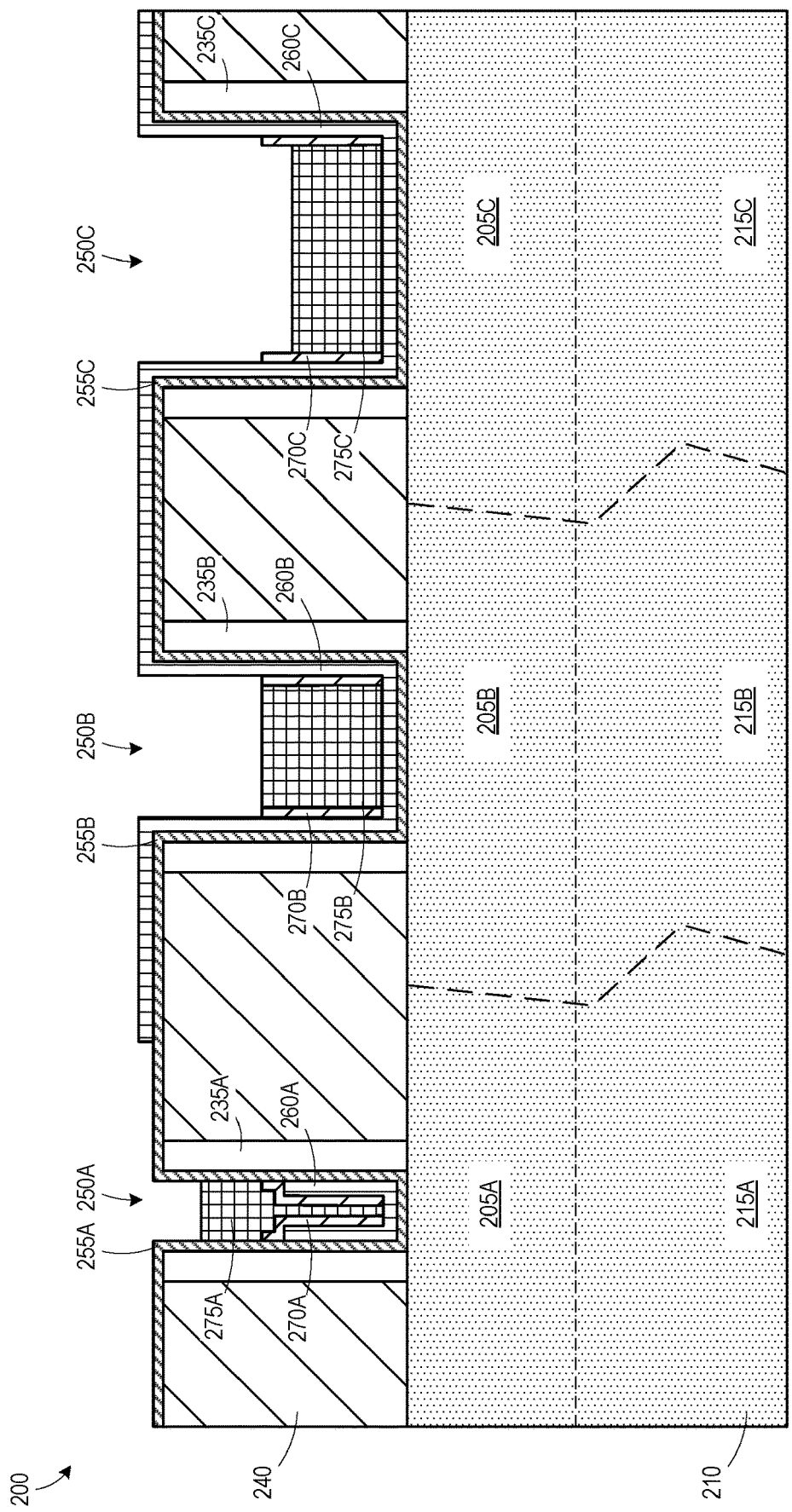

FIG. 2G illustrates the product 200 after a deposition process was performed to form a sacrificial layer 275A, 275B, 275C (e.g., OPL) in the gate cavities 250A, 250B, 250C. The sacrificial layer 275A, 275B, 275C may be formed using a spin-coating process. The thickness of the sacrificial layer 275A, 275B, 275C depends on the depth of the respective gate cavity 250A, 250B, 250C.

Figure 2H:
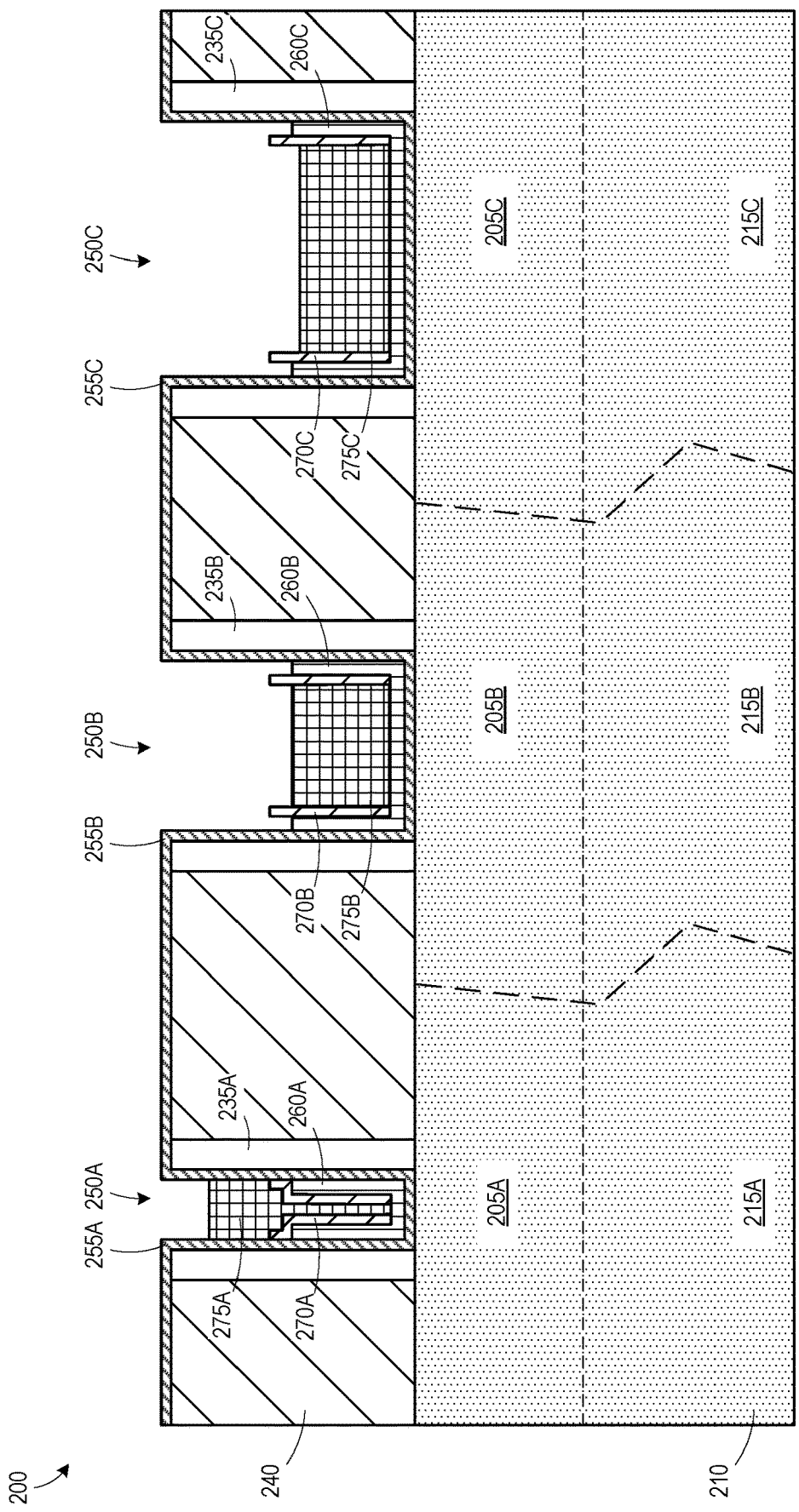

FIG. 2H illustrates the product 200 after an isotropic etch process was performed to chamfer the WFM layers 260B, 260C using the spacers 270B, 270C and the sacrificial layer 275A, 275B, 275C as an etch mask. Note that the sacrificial layer 275A covers the spacers 270A and no further etching of the WFM layer 260A occurs. The WFM layer 260A was previously chamfered due to the relative aspect ratios of the gate cavities 250A, 250B, 250C. The height of the spacers 270B, 270C and the isotropic etch time are selected so that the heights of the chamfered WFM layers 260B, 260C are approximately equal to the height of the previously chamfered WFM layer 260A. In some embodiments, the isotropic etching may continue, such that the height of the chamfered WFM layers 260B, 260C is less than that of the spacers 270B, 270C. The height of the spacers and the isotropic etch time are selected to provide the degree of etching beyond the height of the spacers 270B, 270C. Although a relatively small degree of etch extension past the spacers 270B, 270C is illustrated in FIG. 2H, in some embodiments, the extension may be greater than half of the height of the spacers 270B, 270C.

Figure 2I:
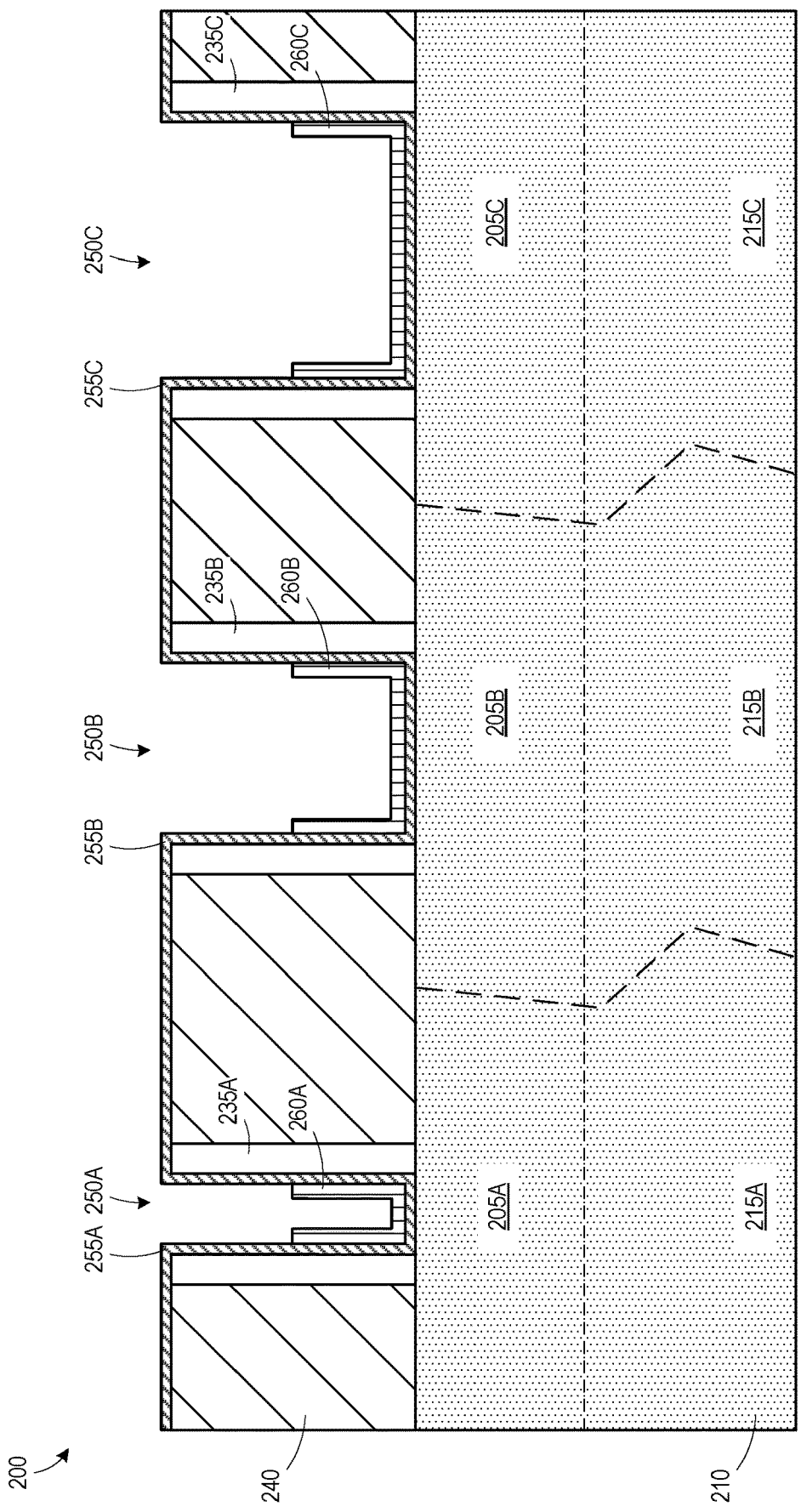

FIG. 2I illustrates the product 200 after a plurality of processes were performed. A process (e.g., ashing) was performed to remove the sacrificial layer 275A, 275B, 275C. An etch process was performed to remove the spacers 270A, 270B, 270C. Due to the spacer-constrained etch, the heights of the chamfered WFM layers 260A, 260B, 260C do not vary depending on the widths of the gate cavities 250A, 250B, 250C.

Figure 2J:
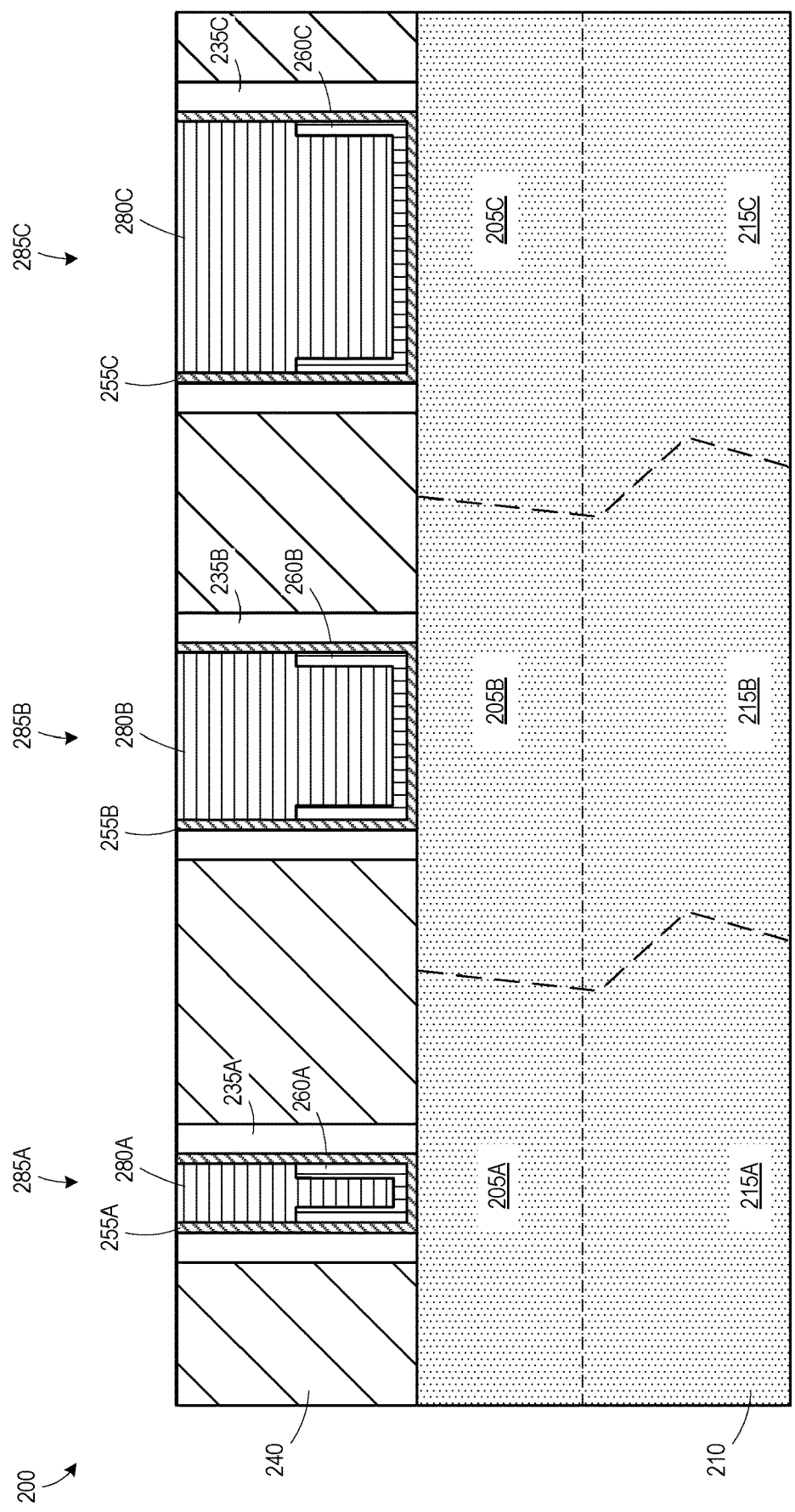

FIG. 2J illustrates the product 200 after a deposition process was performed to fill the gate cavities 250A, 250B, 250C with a conductive gate electrode material 280A, 280B, 280C (e.g., tungsten, polysilicon, aluminum, etc.) and a planarization process was performed to remove excess portions of the conductive gate electrode material 280A, 280B, 280C and excess amounts of other materials above the upper surface of the layer of dielectric layer 240. This process results in the definition of replacement gate electrode structures 285A, 285B, 285C. The fins 205A, 205B, 205C and the replacement gate electrode structures 285A, 285B, 285C define portions of transistor devices. Other steps, not detailed herein, may be performed to complete the product 200, such as the forming of metallization layers including lines and contacts to interconnect various portions of the device.

Figure 2K:
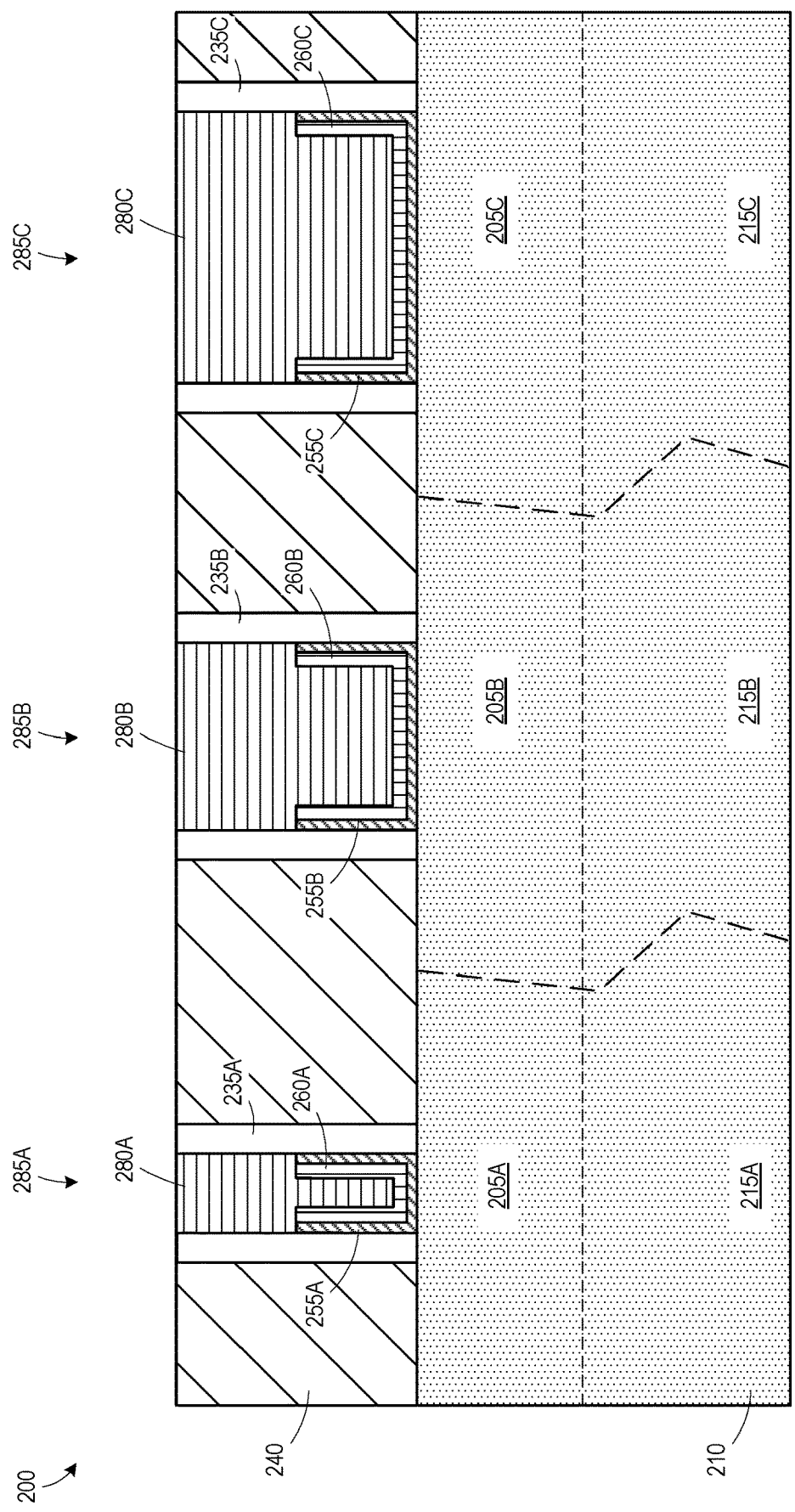

FIG. 2K illustrates an alternative embodiment of the product 200, where the gate insulation layer 255A, 255B, 255C was also chamfered with the WFM layers 260A, 260B, 260C. This chamfering may be performed using a selective etch at the points in the process flow shown in FIG. 2D for the gate insulation layer 255A and FIG. 2H for the gate insulation layers 255B, 255C.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a first cavity having a first width and a second cavity having a second width greater than said first width in a dielectric material;
   forming a first conformal layer in said first and second cavities;
   forming spacers in said first and second cavities, said spacers covering a first portion of said first conformal layer positioned on sidewalls of said first and second cavities, exposing a second portion of said first conformal layer positioned on said sidewalls of said first and second cavities, and exposing bottom portions of said first conformal layer positioned on lowermost surfaces of said first and second cavities;
   forming a material layer in said first and second cavities to cover said bottom portions of said first conformal layer;
   performing a first etch process to remove said second portion of said first conformal layer positioned on said sidewalls of said first and second cavities;

removing said spacers and said material layer to expose said bottom portions of said first conformal layer; and forming a fill material in said first and second cavities.

2. The method of claim 1, wherein said fill material comprises a conductive material.

3. The method of claim 2, wherein said first conformal layer comprises a work function material.

4. The method of claim 3, further comprising forming a gate insulation layer in said first and second cavities prior to forming said first conformal layer.

5. The method of claim 4, further comprising performing a second etch process to remove portions of said gate insulation layer positioned on said sidewalls of said first and second cavities not covered by said spacers.

6. The method of claim 1, wherein said first etch process removes a third portion of said first conformal layer positioned between said spacers and said sidewalls.

7. The method of claim 1, wherein forming said first and second cavities comprises:
forming placeholder gate structures above a substrate;
forming dielectric spacers on sidewalls of said placeholder gate structures;
forming a dielectric layer between said dielectric spacers; and
removing said placeholder gate structures between selected pairs of said dielectric spacers to define said first and second cavities.

8. The method of claim 1, further comprising:
forming a third cavity in said dielectric material having a third width less than said first width;
forming said first conformal layer in said third cavity;
forming a mask layer covering said first and second cavities prior to forming said spacers;
chamfering said first conformal layer in said third cavity; and
removing said mask layer after chamfering said first conformal layer in said third cavity, wherein a height of said first conformal layer in said third cavity is substantially equal to heights of said first conformal layer in said first and second cavities after said first etch process.

9. The method of claim 8, further comprising forming said material layer in said third cavity, wherein said material layer has a height greater than a height of said chamfered first conformal layer.

10. The method of claim 1, wherein forming said spacers comprises:
forming a spacer layer above said first conformal layer; and
performing an anisotropic etch process on said spacer layer to define said spacers.

11. The method of claim 1, wherein said first etch process comprises an isotropic etch process.

12. The method of claim 1, wherein said first conformal layer comprises one of TiN or TiAlC.

13. A method, comprising:
forming placeholder gate structures above a substrate;
forming first spacers on sidewalls of said placeholder gate structures;
forming a dielectric layer between said first spacers;
removing said placeholder gate structures between selected pairs of said first spacers to define first and second cavities, said first cavity having a first width and said second cavity having a second width greater than said first width;
forming a gate insulation layer in said first and second cavities;
forming a work function material layer above said gate insulation layer;
forming second spacers in said first and second cavities, said second spacers covering a first portion of said work function material layer positioned on sidewalls of said first and second cavities, exposing a second portion of said work function material layer positioned on said sidewalls of said first and second cavities, and exposing bottom portions of said first work function material layer positioned on lowermost surfaces of said first and second cavities;
forming a material layer in said first and second cavities to cover said bottom portions of said work function material layer;
performing a first etch process to remove said second portion of said work function material layer positioned on said sidewalls of said first and second cavities;
removing said second spacers and said material layer to expose said bottom portions of said first work function material layer; and
forming a conductive fill material in said first and second cavities.

14. The method of claim 13, further comprising performing a second etch process to remove portions of said gate insulation layer positioned on said sidewalls of said first and second cavities not covered by said second spacers.

15. The method of claim 13, wherein said first etch process removes a third portion of said work function material layer positioned between said second spacers and said sidewalls.

16. The method of claim 13, wherein removing said placeholder gate structures between said selected pairs of said first spacers comprises removing said placeholder gate structures between said selected pairs of said first spacers to define a third cavity having a third width less than said first width, and the method further comprises:
forming said work function material layer in said third cavity;
forming a mask layer covering said first and second cavities prior to forming said second spacers;
chamfering said work function material layer in said third cavity; and
removing said mask layer after chamfering said work function material layer in said third cavity, wherein a height of said work function material layer in said third cavity is substantially equal to heights of said work function material layer in said first and second cavities after said first etch process.

17. The method of claim 16, further comprising forming said material layer in said third cavity, wherein said material layer has a height greater than a height of said chamfered work function material layer.

18. The method of claim 13, wherein forming said second spacers comprises:
forming a spacer layer above said work function material layer; and
performing an anisotropic etch process on said spacer layer to define said second spacers.

19. The method of claim 13, wherein said first etch process comprises an isotropic etch process.

20. The method of claim 13, wherein said work function material layer comprises one of TiN or TiAlC.

* * * * *